July 9, 1968 L. A. MEACHAM 3,392,344

LINEAR TRANSISTOR CIRCUIT FOR NEGATIVE IMPEDANCE NETWORK

Filed Sept. 12, 1966

INVENTOR
L. A. MEACHAM
BY John P. McDonnell
ATTORNEY

United States Patent Office 3,392,344
Patented July 9, 1968

3,392,344

LINEAR TRANSISTOR CIRCUIT FOR NEGATIVE IMPEDANCE NETWORK

Larned A. Meacham, New Providence, N.J., assignor to Bell Telephone Laboratories, Incorporated, Berkeley Heights, N.J., a corporation of New York Filed Sept. 12, 1966, Ser. No. 578,724
5 Claims. (Cl. 330—24)

This invention relates to electrical circuits employing semiconductor translating devices and more particularly to circuitry for substantially reducing nonlinearities inherent in such devices.

With the development of the semiconductor art, the utilization of transistors in amplifier circuitry has become so widespread as to be almost commonplace. However, the utilization of semiconductor junction devices, such as transistors, in circuits requiring very linear gain functions has generally required elaborate and costly circuit modification in order to compensate for the nonlinearity inherent in such devices due to the logarithmic variation of junction current with voltage. Illustratively, the impedance of the base-emitter junction of a transistor varies nonlinearly with the emitter current variations associated with an input signal. As a result of this nonlinear characteristic, signal translation through such devices is nonlinear and therefore accompanied by the introduction of undesirable harmonics.

Previous attempts at increasing the linearity of transistor amplifiers have included the utilization of feedback circuitry and the selective adjustment of the transistor operating point. The success of these approaches has been tempered by the expensive and complex circuitry required or by the restricted limits of operation. A more successful approach toward providing increased linearity in transistor amplifiers is disclosed in an application filed on Dec. 20, 1965, by R. V. Goordman, Ser. No. 514,929, wherein diodes equal in number to the voltage amplification ratio are employed as a nonlinear collector load to correct the otherwise nonlinear response to the input signal. The relatively large number of diodes which may be required with this approach, however, renders it undesirable for some applications.

Accordingly, it is an object of this invention to increase the linearity of transistor amplifiers without significantly increasing their complexity or cost.

It is still another object of this invention to substantially compensate for the nonlinearity of emitter impedance in a transistor amplifier by the introduction of simple corrective circuitry at the amplifier input.

The present invention introduces simple diode compensation at the input, rather than at the output, of a transistor amplifier to increase the linearity of the amplifier at the input where the nonlinearities arise. In accordance with a principal feature of the invention, the input-output relationship of a transistor amplifier is effectively linearized with the aid of a compensating voltage derived from a single diode connected in the base-emitter path. By connecting this diode to the diode formed by the emitter-base junction of the amplifier transistor so that the directions of easy current flow through each are in opposition, and by providing a separate current path for maintaining proportional currents through the respective diode junctions, the voltage across the terminals of the series circuit comprising the diode and the base-emitter junction is, for a given temperature, caused to be a constant value independent of current. Consequently, any varying input voltage applied across these terminals in series with a constant impedance will produce variations of emitter current proportional to the input voltage variations. Moreover, the corresponding collector current will be $\alpha$, the current amplification factor, times the emitter current. Since $\alpha$ is approximately constant, the output current will vary as a substantially linear reproduction of the emitter current and hence also of the input voltage variations.

Also, as described hereinafter, one specific embodiment of the invention is a circuit improvement of my copending application, Ser. No. 463,601, filed June 14, 1965. This copending application discloses a single two-transistor circuit which requires no local power supply and which exhibits a substantially linear negative impedance over a defined current range. The principles of the present invention are employed to advantage in this negative impedance circuit to effect an increase in linearity by at least an order of magnitude.

In accordance with the features of this specific embodiment of the present invention, a PNP transistor and an NPN transistor are interconnected with the base of each connected to the collector of the other. The bias circuit for each transistor is connected across its base and emitter electrodes and includes the series connection of a resistor with a semiconductor diode so that its direction of easy current flow is opposite to the direction of easy current flow through the emitter-base junction. A common impedance connected in series with the aforementioned biasing resistors functions to provide a current path which permits the controlled augmentation of transistor current to moderate the regenerative current increase through the transistors once a threshold current value is exceeded. The negative input impedance between the emitters of the respective transistors is proportional to the value of this common impedance as described in my copending application. It is to be noted that the collector circuit path of one transistor provides a current path which insures that the currents through the base-emitter junction of the other transistor and its associated diode are always proportional. The inherent difference of the reverse saturation current values for two semiconductor materials (e.g., silicon transistors and germanium diodes) provides each transistor with a D.C. bias required for the negative impedance circuit.

A more complete understanding of the invention, including its objects and features, may be obtained by a consideration of the following detailed description when read in connection with the attached drawings in which.

Figure 1A:
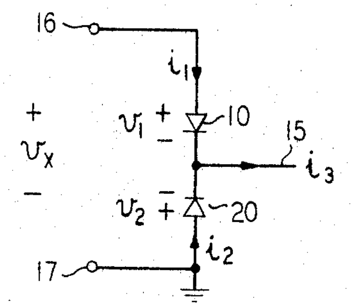
FIG. 1A illustrates a circuit for linearizing the impedance characteristics of a translating device which is here represented by a semiconductor diode.

The circuit of FIG. 1A is useful in explaining fundamental principles of the invention. This circuit shows diode 10 connected in series with, and poled opposite to, diode 20. This series circuit is connected to a source through input terminals 16 and 17. A separate current path 15 carrying current $i_3$ is connected to the junction of the two diodes. The relationship of junction voltage to current of a semiconductor diode follows the well-known relationship:

$$i=I_s\left[\exp\left(\frac{qv}{kT}\right)-1\right] \qquad (1)$$

where $i$ is the current through the diode junction;
$I_s$ is the reverse saturation current of the diode;
$q$ is the charge of an electron;
$v$ is the voltage across the diode junction;
$k$ is Boltzmann's constant; and
T is the absolute temperature.

With the diodes connected as shown (regions of like conductivity or donor impurity concentration being electrically connected) in FIG. 1A, the input voltage $v_x$ is defined as the arithmetic difference between voltages $v_1$ across diode 10 and $v_2$ across diode 20. Diode 10 has the defined junction voltage $v_1$ and junction current $i_1$ while diode 20 has the defined junction voltage $v_2$ and junction current $i_2$. Equation 1 may be solved for the junction voltage which for diode 10 is $$v_1=\frac{kT}{q}\ln\left(\frac{i_1}{I_{s1}}+1\right) \qquad (2)$$

and for diode 20 is $$v_2=\frac{kT}{q}\ln\left(\frac{i_2}{I_{s2}}+1\right) \qquad (3)$$

where $I_{s1}$ and $I_{s2}$ are the respective constant reverse saturation currents indigenous to the semiconductor materials composing diodes 10 and 20, respectively. Accordingly; with both diodes assumed to be at the same temperature, an approximate relationship for $v_x$ may be derived, accurate for the usual working condition in which:

$$i_1>>I_{s1} \text{ and } i_2>>I_{s2}$$

as $$v_x=v_1-v_2=\frac{kT}{q}\left[\ln\frac{i_1}{i_2}+\ln\frac{I_{s2}}{I_{s1}}\right] \qquad (4)$$

For a given temperature and pair of diodes each of terms $k$, T, $q$, $I_{s1}$ and $I_{s2}$ is constant. Therefore, the relationship shown in Equation 4 establishes that the voltage $v_x$ will remain constant as long as the respective diode currents $i_1$ and $i_2$ remain proportional. Thus, if a suitable current supply is connected to conductor 15 so that, for a varying input current $i_1$, the current $i_3$ varies in the appropriate manner to insure that the currents $i_1$ and $i_2$ remain proportional, the driving point voltage between terminals 16 and 17 remains at a constant value; i.e., the voltage variation is zero.

Figure 1B:
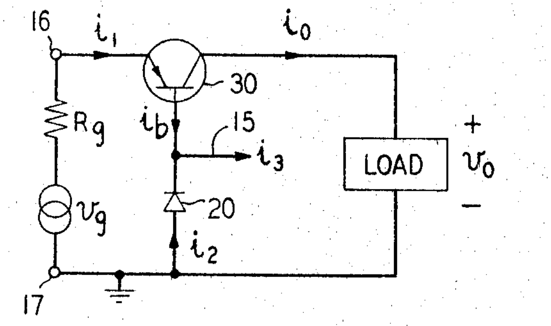
FIG. 1B illustrates a circuit for linearizing the response characteristics of a transistor signal translating device.

The principles of the invention are embodied in an amplifier circuit shown in FIG. 1B wherein diode 10 of FIG. 1A is replaced by the base-emitter diode of transistor 30. If, as before, conductor 15 is connected to a source which supplies a current $i_3$ to insure that the transistor emitter current $i_1$ and diode 20 current $i_2$ remain proportional, the voltage between terminals 16 and 17 will remain constant. The connection of a signal source having voltage $v_g$ and output impedance $R_g$ between terminals 16 and 17 is therefore approximately equivalent to the connection of this source to an ideal transistor having zero emitter resistance and having its base terminal directly grounded. This flows from the fact that the emitter current $i_1$ is now determined solely by the signal source parameters and is no longer influenced by the variations of the emitter impedance with signal amplitude. More specifically, the emitter current $i_1$ is governed by the relationship:

$$i_1=\frac{v_g-v_x}{R_g} \qquad (5)$$

where all quantities on the right side of the equality are constant except $v_g$. Since the collector current $i_0$ is the product of $i_1$ and $\alpha$ (where $\alpha$ is the ratio of collector to emitter currents), and since the $\alpha$ of typical commercial transistors is substantially independent of emitter current and collector voltage, a linear relationship exists between the currents $i_1$ and $i_0$ as well as between the signal voltage $v_g$ and the output current $i_0$.

Figure 2A:
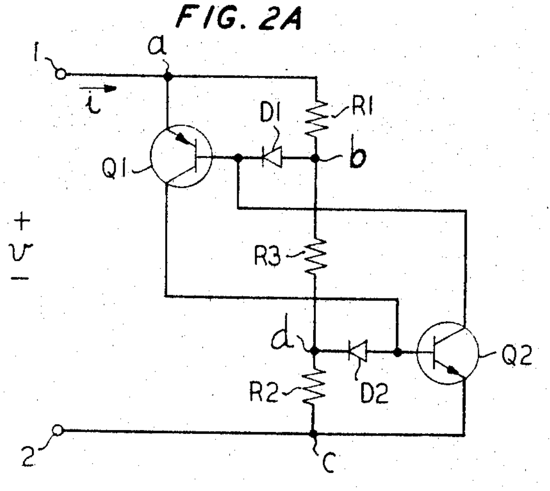
FIG. 2A is a schematic diagram of a negative impedance circuit embodying the principles of the invention.

FIG. 2A discloses a current controlled negative impedance circuit in which the principles of the invention are embodied. The circuit includes a pair of transistors of opposite type conductivity (PNP transistor Q1 and NPN transistor Q2) with biasing resistors R1, R2 and R3 serially connected between the input terminals 1 and 2. The collector of each transistor is connected to the base of the other and the emitter electrodes are connected to the input terminals 1 and 2, respectively. The biasing circuit for transistor Q1 includes the series circuit comprising resistor R1 and diode D1 connected between the base and emitter electrodes. The biasing circuit of transistor Q2 includes the series circuit of resistor R2 and diode D2 connected between its base and emitter electrodes. As explained in connection with FIG. 1B, the diode formed by the base-emitter junction of each transistor and the associated externally connected compensating diode are connected so that the directions of easy current flow in each are in opposition. This of course requires that the base of the transistor be connected to a region of similar type conductivity (i.e., impurity concentration) in the associated diode. Illustratively, the base of a PNP transistor (being composed of N type material) is connected to the N type material in the diode.

If the diodes were shorted out, the circuit of FIG. 2A would operate in the manner described in my copending application, filed June 14, 1965, having Ser. No. 463,601, to produce a voltage-current characteristic similar to that shown in the dashed curve of FIG. 2B. As explained in my copending application, the initial increase of voltage with current from the origin is represented as a positive linear slope determined by the sum of the resistance values of resistors R1, R2 and R3. The current through these resistors increases until a threshold value is reached whereupon, in the absence of resistor R3, the collector currents of each of the transistors will regeneratively increase until the transistors saturate. As discussed in my copending application, the presence of resistor R3 with a value smaller than the current source impedance effects a controlled current augmentation between the transistors to provide a region of stable negative slope in the characteristic. This region of negative slope extends over the current range between the threshold value and the point at which the transistors saturate. The negative sloping portion of the characteristic corresponds to a negative impedance between terminals 1 and 2 proportional to the value of resistor R3. As noted in my copending application, this negative sloping portion of the characteristic is slightly concave downward due mainly to the variation of the emitter-base junction impedance with emitter current (and only insignificantly to any change in $\alpha$ with collector current). By modifying the circuits disclosed in my copending application according to the teachings of the present invention, the linearity of the negative sloping region can be increased by at least an order of magnitude, as illustrated by the solid curve of FIG. 2B.

Figure 2B:
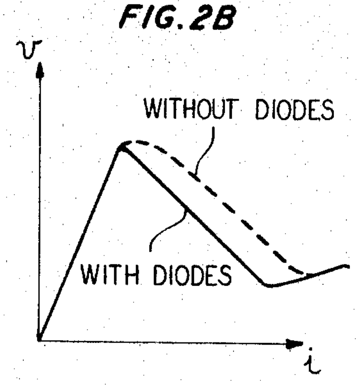
FIG. 2B is a graph representing typical characteristics of the circuit shown in FIG. 2A.

The proportional relationship between the emitter current of each transistor and the current through its associated diode in the circuit shown in FIG. 2A is evident from a consideration of the following in connection with FIG. 2B. As described, the current $i$ applied to terminals 1 and 2 increases from zero and flows through the series circuit which includes resistors R1, R2 and R3 until the threshold value (i.e., the point at which the transistors become forward biased into conduction by the voltage drops across R1 and R2) is reached. After this threshold value of current $i$ is exceeded, the current path for all but a very small fraction of any further increase in current $i$ effectively includes terminal 1, emitter-collector electrodes of transistor Q1, diode D2, resistor R3, diode D1, collector-emitter electrodes of transistor Q2 and terminal 2. The excepted small fraction referred to is the base current for each transistor, which bypasses part of this path, flowing to or from the collector electrode of the other transistor. Since the current amplification factor $\alpha$ is substantially constant and close to unity for most commercial transistors, and since the base current of each transistor is only $1-\alpha/\alpha$ times its emitter current, it is evident that substantially the same almost entire increase in current $i$, as previously noted, passes through both diodes and the emitter-base junctions of both transistors. Being substantially equal, the emitter and associated diode currents are of course substantially proportional, for both Q1 and Q2.

In summary, when the diodes D1 and D2 are connected with proper polarity in series with the respective bases of transistors Q1 and Q2, the collector circuit of each transistor provides the current path necessary for the maintenance of proportional currents through the base-emitter and associated diode junctions of the other so that the circuit of FIG. 2A operates to provide an extremely linear negative resistance region. The characteristic exhibits a sharp transition (approximating a cusp) from the positive resistance regions to either side of the negative sloping region.

As explained in connection with the circuit of FIG. 1B, the voltage between points $a$ and $b$ and between points $c$ and $d$ in FIG. 2A remains at a constant value independent of the transistor current. If transistors Q1 and Q2 are of the silicon variety and diodes D1 and D2 are of the germanium variety, the values of reverse saturation currents $I_{s1}$ and $I_{s2}$ are roughly $10^{-14}$ and $10^{-6}$ ampere, respectively. When the currents $i_1$ and $i_2$ are equal and the semiconductors are operating near room temperature, the value of the voltage $v_x$ from Equation 4 is constant at approximately 0.5 volt independent of current (as long as the current is well above a microampere). Therefore by utilizing the inherent differences between the two semiconductor materials (silicon for the transistor and germanium for the diode) there is provided a constant DC bias for each transistor which prevents its conduction unless current $i$ exceeds its threshold value, at which the drops across R1 and R2 equal the bias. Without such bias, the negative resistance region would begin at or near the origin in FIG. 2B and thus clearly could not extend over a useful current range.

Since the voltage between the circuit terminals 1 and 2 is the summation of the voltages across resistors R1, R2 and R3 and since the voltages across resistors R1 and R2 are fixed at the constant value noted in the preceding paragraph, the negative impedance slope is due solely to the current variation in resistor R3. This current variation is linearly related to the input current. Since the voltage across and the current through fixed resistor R3 are linearly related, the voltage variation in the negative impedance region exhibits an extremely linear negative slope.

As discussed in my noted copending application, resistor R3 may be replaced with a generalized impedance and emitter feedback resistors may be included to further increase the linearity of the circuit. Furthermore, in accordance with the teachings of my prior application, the circuit may be constructed with a single PNPN device to replace the two transistors. Additionally, the other negative impedance circuits disclosed in the copending application may be modified in accordance with the teachings of the instant invention. In each case the circuit operates as an impedance converter with the negative driving point impedance proportional to the value of the impedance represented by R3.

Figure 3:
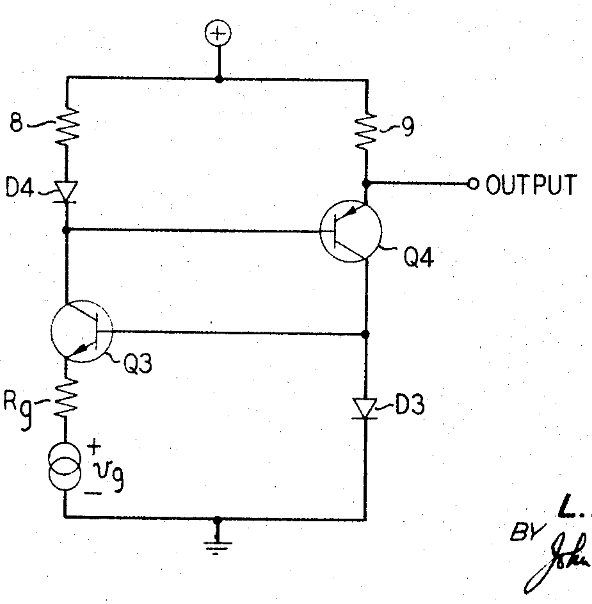
FIG. 3 is a schematic diagram of a two-stage linear transistor amplifier embodying the principles of the invention.

FIG. 3 is another amplifier circuit embodying the principles of the invention. A pair of germanium transistors of opposite type conductivity (Q3 being a PNP transistor and Q4 being an NPN transistor) are connected to diodes D3 and D4 in accordance with the teachings of the invention. Transistor Q3 is connected as a common base stage with diode D3 having its P type material region connected to the P type material region of the base of transistor Q3. Transistor Q4 is connected as an emitter follower stage with diode D4 providing the compensation required. The emitter and collector currents of the two transistors are all substantially proportional, and the collector current of each transistor is passed through the diode associated with the other transistor. A signal generator having voltage $v_g$ and output impedance $R_g$ is connected to the emitter electrode of transistor Q3. With the diode and emitter currents maintained proportional to each other, the collector current of transistor Q3 is linearly related to the voltage $v_g$ of the signal generator and thus the output voltage drop across resistor 8 is a linearly amplified value of the signal generator voltage $v_g$. The voltage across resistor 8 serves as the input voltage to transistor Q4 which, being similarly compensated, produces an output voltage across resistor 9 which is linearly related to the voltage across resistor 8. With transistor Q3 providing a voltage gain and transistor Q4 providing a current gain, voltage at the output terminal is a substantially linear duplication of the signal voltage $v_g$. It is to be noted that diodes D3 and D4 may be either of the silicon or germanium type.

It is possible to construct other amplifier circuits different from the one described in FIG. 3 which employ the teachings of the invention. As long as a diode is connected with its voltage effectively in series with the base-emitter path, and the diode is polled so that its forward direction of current is opposite to that of the emitter base junction, and as long as the diode current is proportional to the emitter current, linear compensation of transistor amplifier circuits is effected. Various combinations of silicon elements with germanium elements are possible and wholly within the scope of this invention. It is to be understood that the above-described arrangements are illustrative of the application of the principles of the invention. Numerous other arrangements may be devised by those skilled in the art without departing from the spirit and scope of the invention.

I claim:

1. In combination, first and second complementary transistors each having at least a base, emitter, and collector electrodes, a first diode having one of its two electrodes connected to the base of said first transistor with the direction of easy current flow through said first diode being opposite to current flow through the base-emitter junction of said first transistor, a second diode having one of its two electrodes connected to the base of said second transistor with the direction of easy current flow through said second diode being opposite to current flow through the base-emitter junction of said second transistor, first means for connecting the base of said first transistor to the collector of said second transistor, second means for connecting the base of said second transistor to the collector of said first transistor, a first impedance means for connecting a potential source between the emitter of said first transistor and the other of said two electrodes of said second diode, and a second impedance means for connecting said potential source between the emitter of said second transistor and the other of said two electrodes of said first diode, whereby the resulting current in the emitter of each transistor is proportional to current in the respective diode connected to the base electrodes of said each transistor.

2. The combination as defined in claim 1 wherein said first impedance means includes a first resistor connected between one side of said potential source and said other electrode of said second diode, said second impedance means includes a second resistor connected between the other side of said potential source and said other electrode of said first diode, and the combination further includes a third impedance means connected between said other electrode of said first diode and said other electrode of said second diode, whereby the impedance presented to said potential source is negative and substantially equal in magnitude to said third impedance means for a range of currents supplied by said potential source.

3. The combination as defined in claim 1 wherein said first impedance means includes a first resistor connected between one side of said potential source and the emitter of said first transistor, and said second impedance means includes means for connecting a voltage generator between the emitter of said second transistor and the other side of said potential source, whereby the variations in voltage across said first resistor are a linearly amplified replica of signals generated by said voltage generator.

4. A two terminal negative impedance circuit comprising a PNP and NPN transistor each having a base, emitter and collector electrodes, a first diode means having its cathode connected to the base of said PNP transistor and its anode connected through a first impedance to the emitter of said PNP transistor, a second diode means having its anode connected to the base of said NPN transistor and its cathode connected through a second impedance to the emitter of said NPN transistor, first means for connecting the base of said NPN transistor to the collector of said PNP transistor, second means for connecting the base of said PNP transistor to the collector of said NPN transistor, a third impedance connected between the anode of said first diode means and the cathode of said second diode means, and means for connecting a first one of said two terminals to the emitter of said PNP transistor and a second one of said two terminals to the emitter of said NPN transistor.

5. An amplifier circuit comprising first and second complementary transistors each having at least a base, emitter, and collector electrodes, a first diode having one of its two electrodes connected to the base of said first transistor with the direction of easy current flow through said first diode being opposite to current flow through the base-emitter junction of said first transistor, a second diode having one of its two electrodes connected to the base of said second transistor with the direction of easy current flow through said second diode being opposite to current flow through the base-emitter junction of said second transistor, first means for connecting the base of said first transistor to the collector of said second transistor, second means for connecting the base of said second transistor to the collector of said first transistor, a first impedance means for connecting a potential source between the emitter of said first transistor and the other of said two electrodes of said second diode, a second impedance for connecting the other of said two electrodes of said first diode to one side of said potential source, and means for connecting a voltage generator between the emitter of said second transistor and the other side of said potential source, whereby variations in voltage across said first impedance are a linearly amplified replica of signals generated by said voltage generator.

References Cited

UNITED STATES PATENTS

| | | | |
|---|---|---|---|
| 2,842,669 | 7/1958 | Thomas | 330—24 X |
| 3,161,833 | 12/1964 | Ross | 330—24 |

ROY LAKE, *Primary Examiner.*

L. J. DAHL, *Assistant Examiner.*